(12) United States Patent
Yang et al.

(10) Patent No.: US 9,153,700 B2
(45) Date of Patent: Oct. 6, 2015

(54) METHOD OF MANUFACTURING THIN-FILM TRANSISTOR, METHOD OF MANUFACTURING ORGANIC LIGHT-EMITTING DISPLAY DEVICE INCLUDING THE SAME, AND THIN-FILM TRANSISTOR AND ORGANIC LIGHT-EMITTING DISPLAY DEVICE MANUFACTURED USING THE METHODS

(71) Applicant: Samsung Display Co., LTD., Yongin, Gyeonggi-do (KR)

(72) Inventors: Hui-Won Yang, Yongin (KR); Chaun-Gi Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/034,291

(22) Filed: Sep. 23, 2013

(65) Prior Publication Data

US 2014/0312320 A1    Oct. 23, 2014

(30) Foreign Application Priority Data

Apr. 18, 2013  (KR) ........................ 10-2013-0043032

(51) Int. Cl.
*H01L 29/12* (2006.01)
*H01L 29/786* (2006.01)
*H01L 29/66* (2006.01)
*H01L 27/12* (2006.01)
*H01L 27/32* (2006.01)

(52) U.S. Cl.
CPC ........ *H01L 29/7869* (2013.01); *H01L 27/1225* (2013.01); *H01L 27/1255* (2013.01); *H01L 29/66969* (2013.01); *H01L 27/3244* (2013.01)

(58) Field of Classification Search
CPC ............................ H01L 51/52; H01L 51/0508
USPC .......................................................... 257/43
See application file for complete search history.

(56) References Cited

U.S. PATENT DOCUMENTS

| | | | |
|---|---|---|---|
| 2009/0068773 A1* | 3/2009 | Lai et al. ......................... | 438/23 |
| 2011/0240998 A1 | 10/2011 | Morosawa et al. | |
| 2012/0223307 A1* | 9/2012 | Sakata ............................. | 257/43 |
| 2013/0126859 A1* | 5/2013 | Yeh et al. ........................ | 257/43 |

FOREIGN PATENT DOCUMENTS

| | | |
|---|---|---|
| JP | 2007-073558 A | 3/2007 |
| JP | 2007-073560 A | 3/2007 |
| KR | 10-2011-0109885 A | 10/2011 |

* cited by examiner

*Primary Examiner* — Steven Loke
*Assistant Examiner* — Arash Majdi
(74) *Attorney, Agent, or Firm* — Christie, Parker & Hale, LLP

(57) ABSTRACT

A method of manufacturing a thin-film transistor includes: forming an oxide semiconductor pattern including a first region and a second region on a substrate; forming an insulation film on the substrate to cover the oxide semiconductor pattern; removing the insulation film on the second region through patterning; increasing carrier density of the first region of the oxide semiconductor pattern through an annealing process; forming a gate electrode on the insulation film so that the gate electrode is insulated from the oxide semiconductor pattern and overlaps the second region; and forming a source electrode and a drain electrode to be insulated from the gate electrode and contact the first region.

15 Claims, 7 Drawing Sheets

METHOD OF MANUFACTURING THIN-FILM TRANSISTOR, METHOD OF MANUFACTURING ORGANIC LIGHT-EMITTING DISPLAY DEVICE INCLUDING THE SAME, AND THIN-FILM TRANSISTOR AND ORGANIC LIGHT-EMITTING DISPLAY DEVICE MANUFACTURED USING THE METHODS

CROSS-REFERENCE TO RELATED APPLICATION

This application claims priority to and the benefit of Korean Patent Application No. 10-2013-0043032, filed on Apr. 18, 2013, in the Korean Intellectual Property Office, the entire content of which is incorporated herein by reference.

BACKGROUND

1. Field

The following description relates to a method of manufacturing a thin-film transistor having an active layer that includes an oxide semiconductor, a method of manufacturing an organic light-emitting display device including the same, and a thin-film transistor and an organic light-emitting display device manufactured using the methods.

2. Description of the Related Art

A flat display device, such as an organic light-emitting display device, a liquid crystal display device, or the like, is manufactured on a substrate on which at least one thin-film transistor, at least one capacitor, and the like for driving the flat display device and a pattern including wirings for connecting the thin-film transistor, the capacitor, and the like are formed. The thin-film transistor includes an active layer for providing a channel region, a source region, and a drain region. A gate electrode is formed on the channel region and electrically insulated from the active layer by an insulation film.

The active layer of the thin-film transistor is usually formed of a semiconductor material, such as amorphous silicon or poly-silicon. When the active layer is formed of amorphous silicon, it is difficult to implement a driving circuit operating at a high speed since mobility of charges is low, and when the active layer is formed of poly-silicon, mobility is high, but an additional compensation circuit is necessary since a threshold voltage is not uniform. In addition, since a comparable method of manufacturing a thin-film transistor by using low temperature poly-silicon (LTPS) includes an expensive process, such as a laser annealing process, facility investment and management costs are high, and it is difficult to apply the comparable method to a large-area substrate. To solve these problems, research using an oxide semiconductor as an active layer has recently been conducted.

An organic light-emitting display device using an oxide semiconductor has an offset of a set or predetermined interval for an insulation characteristic between a gate electrode and a source/drain wiring in a top gate structure. With this offset, an increase in a resistance at both ends of a source/drain causes a problem of a decrease in a current characteristic of a thin-film transistor. In existing silicon semiconductors using an LTPS process, although an ohmic contact layer is formed by a high-density doped semiconductor as a method for solving this problem, since there are no high-density doping methods for an oxide semiconductor, a method of increasing the carrier density of an active layer through plasma treatment is used, but this method also needs an additional mask process.

SUMMARY

Aspects of embodiments of the present invention are directed toward a method of manufacturing a thin-film transistor, in which a source/drain region of an active layer is conductive by increasing the carrier density of an oxide semiconductor through annealing, and an organic light-emitting display device including the thin-film transistor.

According to an embodiment of the present invention, a method of manufacturing a thin-film transistor includes: forming an oxide semiconductor pattern including a first region and a second region on a substrate; forming an insulation film on the substrate to cover the oxide semiconductor pattern; removing the insulation film on the second region through patterning; increasing a carrier density of the first region through an annealing process; forming a gate electrode on the insulation film so that the gate electrode is insulated from the oxide semiconductor pattern and overlaps the second region; and forming a source electrode and a drain electrode to be insulated from the gate electrode and contact the first region.

Hydrogen in the insulation film may be diffused to the first region through the annealing process.

The insulation film may include silicon nitride ($SiN_x$).

The forming of the gate electrode may include: forming a gate insulation film on the insulation film and the second region to insulate the gate electrode from the oxide semiconductor pattern; and forming the gate electrode on the gate insulation film to overlap the second region.

The gate insulation film may include a material selected from the group consisting of silicon oxide ($SiO_2$), aluminum oxide ($AlO_x$), copper oxide ($CuO_x$), terbium oxide ($Tb_4O_7$), yttrium oxide ($Y_2O_3$), niobium oxide ($Nb_2O_5$), and praseodymium oxide ($Pr_2O_3$).

The oxide semiconductor pattern may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn).

According to another embodiment of the present invention, a method of manufacturing an organic light-emitting display device includes: manufacturing a thin-film transistor on a substrate; forming a protective film on the thin-film transistor; forming an organic light-emitting diode (OLED) on the protective film; and forming a sealing layer to tightly seal the OLED, wherein the manufacturing of the thin-film transistor includes: forming an oxide semiconductor pattern including a first region and a second region on the substrate; forming an insulation film on the substrate to cover the first region but not the second region; increasing a carrier density of the first region through an annealing process; forming a gate electrode which is insulated from the oxide semiconductor pattern and overlaps the second region; and forming a source electrode and a drain electrode to be insulated from the gate electrode and contact the first region.

Hydrogen in the insulation film may be diffused to the first region through the annealing process.

The insulation film may include silicon nitride ($SiN_x$).

The forming of the gate electrode may include: forming a gate insulation film on the insulation film and the second region to insulate the gate electrode from the oxide semiconductor pattern; and forming the gate electrode on the gate insulation film to overlap the second region.

The gate insulation film may include a material selected from the group consisting of silicon oxide ($SiO_2$), aluminum oxide ($AlO_x$), copper oxide ($CuO_x$), terbium oxide ($Tb_4O_7$), yttrium oxide ($Y_2O_3$), niobium oxide ($Nb_2O_5$), and praseodymium oxide ($Pr_2O_3$).

The forming of the oxide semiconductor pattern may further include forming a lower electrode of a capacitor, which includes the oxide semiconductor.

A carrier density of the lower electrode of the capacitor may increase through the annealing process.

The forming of the gate electrode may further include forming an upper electrode of the capacitor.

The oxide semiconductor pattern may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn).

According to another embodiment of the present invention, a thin-film transistor includes: an oxide semiconductor pattern, which is formed on a substrate and includes two first regions and a second region between the two first regions, wherein a carrier density of the two first regions is increased through an annealing process; an insulation film on the two first regions; a gate electrode insulated from the oxide semiconductor pattern and overlaps the second region; and a source electrode and a drain electrode, which are insulated from the gate electrode and contact one of the first regions respectively, wherein the second region has a higher resistance than the two first regions.

The carrier density of the two first regions may be increased by hydrogen that is in the insulation film and is diffused to the two first regions.

The insulation film may include silicon nitride ($SiN_x$).

According to another embodiment of the present invention, an organic light-emitting display device includes: a thin-film transistor; a capacitor including a lower electrode including an oxide semiconductor, an intermediate electrode, and an upper electrode; and an organic light-emitting diode (OLED) including a pixel electrode, an organic light-emitting layer, and an opposed electrode, wherein the thin-film transistor includes: an active layer, which is formed on a substrate, includes an oxide semiconductor, and includes a source region and a drain region of which a carrier density is increased through an annealing process; an insulation film formed on the source region and the drain region; a gate electrode formed to be insulated from the oxide semiconductor and overlap a channel region of the active layer; and a source electrode and a drain electrode, which are insulated from the gate electrode and respectively contact the source region and the drain region.

The insulation film may include silicon nitride ($SiN_x$).

BRIEF DESCRIPTION OF THE DRAWINGS

The above and other features and advantages of the present invention will become more apparent by describing in more detail some example embodiments thereof with reference to the attached drawings in which.

DETAILED DESCRIPTION

Figure 1:
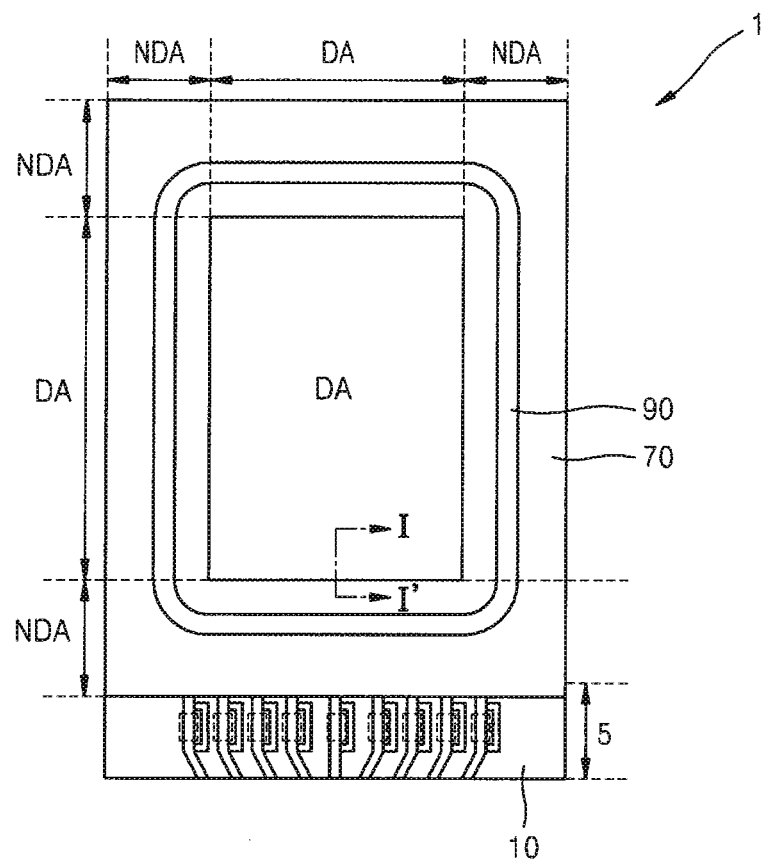
FIG. 1 is a top view showing a schematic structure of an organic light-emitting display device according to an embodiment of the present invention.

The detailed description of embodiments of the present invention to be described below refers to the accompanying drawings in which specific embodiments for carrying out the present invention are shown as illustrations. The embodiments are described in detail for one of ordinary skill in the art to sufficiently carry out the present invention. It should be understood that various embodiments of the present invention are different from each other but do not have to be exclusive from each other. For example, specific shapes, structures and characteristics set forth in the specification may be modified and implemented from one embodiment to another embodiment without departing from the spirit and scope of the present invention. In addition, it should be understood that a position or disposition of each component in each embodiment may also be changed without departing from the spirit and scope of the present invention. Therefore, the detailed description to be described below is not made to be limiting, and it should be understood that the scope of the present invention covers the scope claimed by the claims and all their equivalent scopes. In the drawings, like reference numerals denote the same or like components in various terms.

Hereinafter, various embodiments of the present invention are described in more detail with reference to the accompanying drawings for one of ordinary skill in the art to easily carry out the present invention.

As used herein, the term "and/or" includes any and all combinations of one or more of the associated listed items. Expressions such as "at least one of," when preceding a list of elements, modify the entire list of elements and do not modify the individual elements of the list.

FIG. 1 is a top view showing a schematic structure of an organic light-emitting display device 1 according to an embodiment of the present invention.

Referring to FIG. 1, the organic light-emitting display device 1 includes a first substrate 10, which includes a plurality of light-emitting pixels, and a second substrate 70 adhesively joined to the first substrate 10 through sealing.

On the first substrate 10, a thin-film transistor, an organic light-emitting diode (OLED), a capacitor, and so forth may be formed. In addition, the first substrate 10 may be a low temperature poly-silicon (LTPS) substrate (crystalline silicon substrate), a glass substrate, a plastic substrate, or the like.

The second substrate 70 may be an encapsulation substrate disposed on the first substrate 10 to block the thin-film transistor, the light-emitting pixels and other components included in the first substrate 10 from external humidity, air, or the like. The second substrate 70 is located to face the first substrate 10, and the first substrate 10 and the second substrate 70 are adhesively joined to each other by a sealing member 90 disposed along edges thereof. The second substrate 70 may be a glass substrate, a plastic substrate, or a stainless steel substrate.

Although not shown, by forming a sealing film of the second substrate 70 on the first substrate 10 to seal a light-emitting region, the light-emitting region can be protected from the external air. For example, the sealing film may have a film structure in which a film formed of an inorganic material, such as a silicon oxide or a silicon nitride, and a film formed of an organic material, such as epoxy or polyimide, are alternately formed. As another example, the sealing film may have a film structure including low melting glass, such as a tin oxide (SnO). The sealing film described above is only illustrative and is not limited thereto. Any sealing structure for a thin film is applicable to the sealing film.

The first substrate 10 includes a light-emitting region DA from which light is emitted and a non-light-emitting region NDA located around the light-emitting region DA. According to embodiments of the present invention, the sealing member 90 is disposed in the non-light-emitting region NDA located around the light-emitting region DA to adhesively join the first substrate 10 and the second substrate 70 to each other.

As described above, in the light-emitting region DA of the first substrate 10, the OLED, the thin-film transistor for driving the OLED, and a wiring electrically connected thereto are formed. In addition, the non-light-emitting region NDA may include a pad region 5 in which a pad electrode extending from the wiring of the light-emitting region DA is located.

Figure 2:
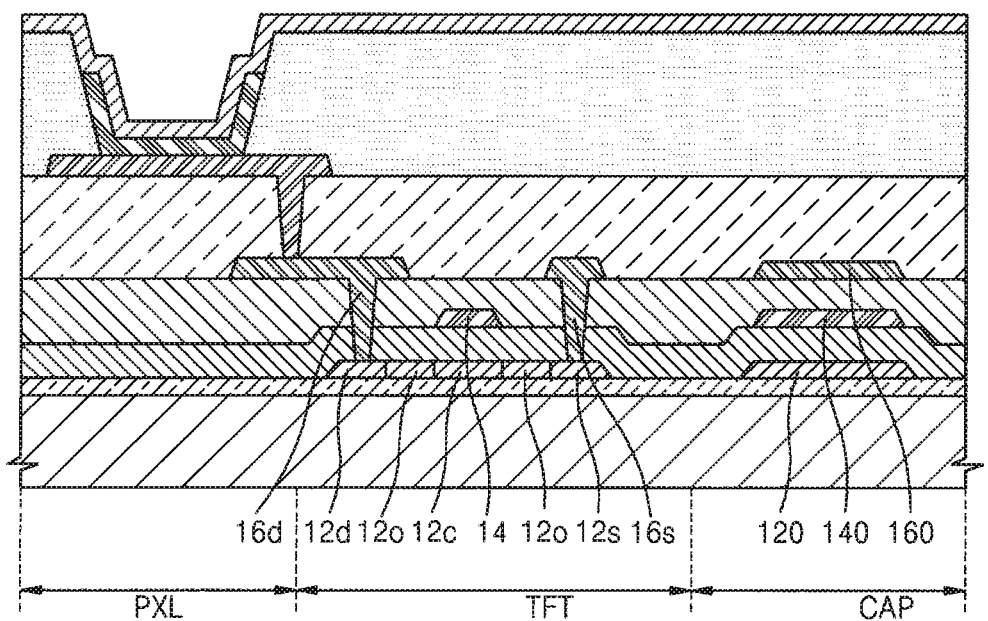
FIG. 2 is a cross-sectional view of a comparable organic light-emitting display device.

FIG. 2 is a cross-sectional view of a comparison example compared with a thin-film transistor according to an embodiment of the present invention.

A thin-film transistor (including an oxide semiconductor layer as an active layer) may be implemented as a bottom gate thin-film transistor or a top gate thin-film transistor. The bottom gate thin-film transistor has a structure in which a gate electrode is located below an active layer, and the top gate thin-film transistor has a structure in which a gate electrode is located above an active layer.

Since the bottom gate thin-film transistor has a large parasitic capacity, when the bottom gate thin-film transistor is used as a thin-film transistor included in a display device, the bottom gate thin-film transistor causes an increase in power consumption, a decrease in an aperture ratio, and an increase in a dead space. Thus, in one embodiment, a thin-film transistor included in a display device for realizing low power consumption and high resolution by reducing a parasitic capacity is implemented as a top gate thin-film transistor.

In addition, when a thin-film transistor (including an oxide semiconductor layer as an active layer) is implemented as a top gate thin-film transistor, there is a problem that an offset region 12o at a set or predetermined part occurs, resulting in an insulation characteristic between a gate electrode 14 and a source/drain electrode 16s/16d. Since the oxide semiconductor layer as the active layer has higher effective mobility of charges than a silicon material, a separate doping process for the thin-film transistor including an oxide semiconductor layer as an active layer is not necessary. However, when the thin-film transistor is implemented as a top gate thin-film transistor without a doping process, the offset region 12o exists. As shown in FIG. 2, the offset region 12o indicates a region between a channel region 12c, which overlaps the gate electrode 14, and a source/drain region 12s/12d, which contacts the source/drain electrode 16s/16d. As such, when the offset region 12o exists, the characteristic of the thin-film transistor is not stable due to an increase in a resistance at both ends of the source/drain electrode 16s/16d.

According to an embodiment of the present invention, a method of removing an offset of a thin-film transistor as a top gate thin-film transistor, which includes an oxide semiconductor layer as an active layer, is described. Hereinafter in FIG. 3, the light-emitting region DA is described based on a cross-section of the organic light-emitting display device 1 cut along line I-I' of FIG. 1, according to an embodiment of the present invention.

Figure 3:
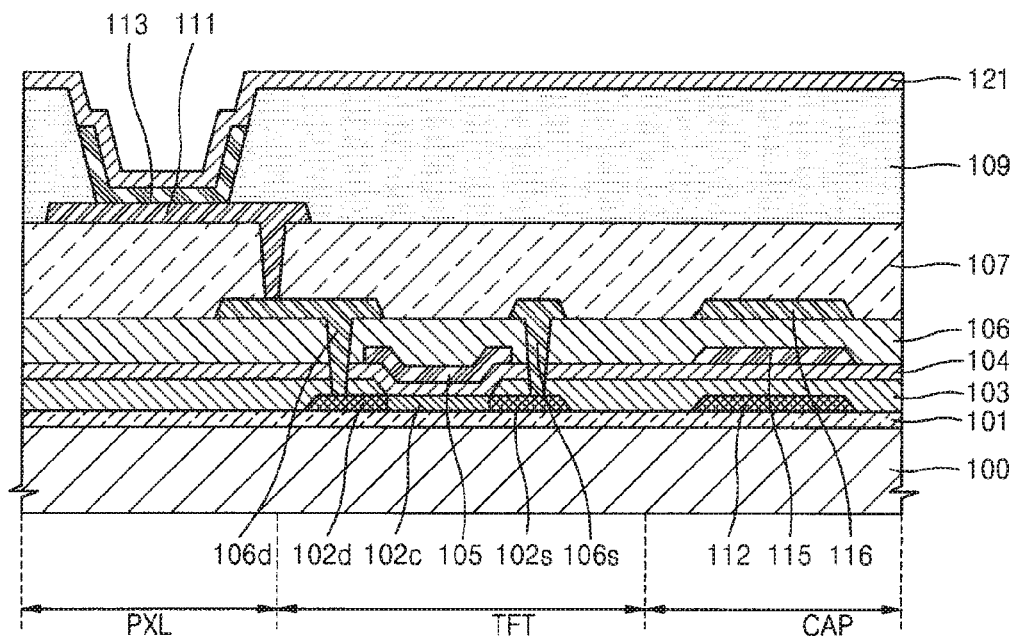
FIG. 3 is a cross-sectional view along line I-I' of FIG. 1, according to an embodiment of the present invention.
Figure 4:
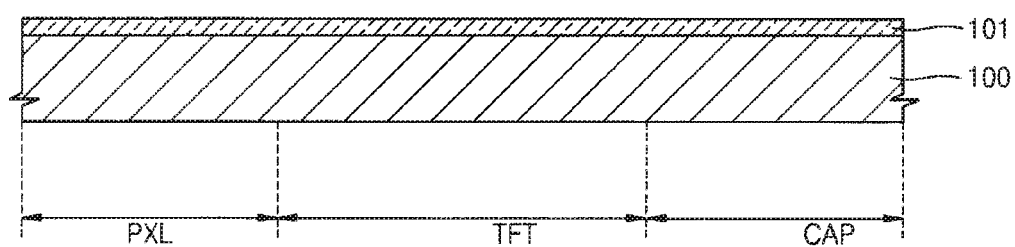
FIGS. 4 to 10 are schematic cross-sectional views for describing a process of manufacturing the organic light-emitting display device of FIG. 3, according to embodiments of the present invention.

FIG. 3 is a cross-sectional view along line I-I' of FIG. 1, according to an embodiment of the present invention, Referring to FIG. 3, the organic light-emitting display device 1 includes at least one thin-film transistor, at least one capacitor, and an OLED electrically connected to the thin-film transistor. The thin-film transistor, the capacitor, and the OLED are formed in a thin-film transistor region TFT, a capacitor region CAP, and a pixel region PXL, respectively.

The thin-film transistor according to the current embodiment is a top gate thin-film transistor and sequentially includes an active layer 102 (including 102d, 102c and 102s) formed by an oxide semiconductor pattern, a gate electrode 105 insulated from the active layer 102, and a source/drain electrode 106s/106d, which is insulated from the gate electrode 105 and contacts the active layer 102.

The active layer 102 including an oxide semiconductor includes a source/drain region 102s/102d and a channel region 102c. The source/drain region 102s/102d is a region that the source/drain electrode 106s/106d contacts. In the thin-film transistor of FIG. 3, the source/drain region 102s/102d is conductive due to an increase in the carrier density thereof by the inflow of hydrogen into the source/drain region 102s/102d through annealing of the active layer 102 that is an oxide semiconductor layer. By making a portion of the active layer 102 conductive through annealing, a stable thin-film transistor as a top gate thin-film transistor in which an offset region does not exist can be manufactured even though an oxide semiconductor is used for the active layer 102. Consequently, even though an oxide semiconductor is used, since a portion of an active layer region acts as a conductor, an organic light-emitting display device of which a parasitic capacity is small, an aperture ratio is high, and a characteristic is stable can be manufactured.

The capacitor includes a lower electrode 112, an intermediate electrode 115, and an upper electrode 116. The lower electrode 112 is characterized in that it includes a conductive oxide semiconductor. In more detail, according to an embodiment of the present invention, since hydrogen in a first insulation film 103 is diffused to the lower electrode 112 of the capacitor through annealing, the lower electrode 112 is conductive due to an increase in the carrier density thereof. Thus, the capacitor further includes a sub-capacitor of which the two electrodes are the intermediate electrode 115 and the upper electrode 116 in addition to a capacitor of which the two electrodes are the lower electrode 112 (which includes the conductive oxide semiconductor), and the intermediate electrode 115.

According to an embodiment of the present invention, by increasing the carrier density of an offset region through annealing to improve a contact resistance, a characteristic of a top gate thin-film transistor using an oxide semiconductor can be enhanced.

FIGS. 4 to 10 are schematic cross-sectional views for describing a process of manufacturing the organic light-emitting display device 1 of FIG. 3, according to embodiments of the present invention. Hereinafter, the process of manufacturing the organic light-emitting display device 1 of FIG. 3 is schematically described.

A substrate 100 for manufacturing the organic light-emitting display device 1 is prepared.

In more detail, the substrate 100 may be formed of a transparent glass material having a silicon oxide ($SiO_2$) as a main component. The substrate 100 is not limited thereto, and substrates of various suitable materials, such as a transparent plastic material, a transparent metallic material, or the like, can be used.

An auxiliary layer 101, such as a barrier layer, a blocking layer, and/or a buffer layer, for preventing diffusion of impurity ions, preventing permeation of humidity or external air, and planarizing a surface may be provided on an upper surface of the substrate 100. The auxiliary layer 101 may be formed by various deposition methods, such as a plasma enhanced chemical vapor deposition (PECVD) method, an atmospheric pressure CVD (APCVD) method, a low pressure CVD (LPCVD) method, or the like, using a silicon oxide ($SiO_2$) and/or a silicon nitride ($SiN_x$).

Figure 5A:
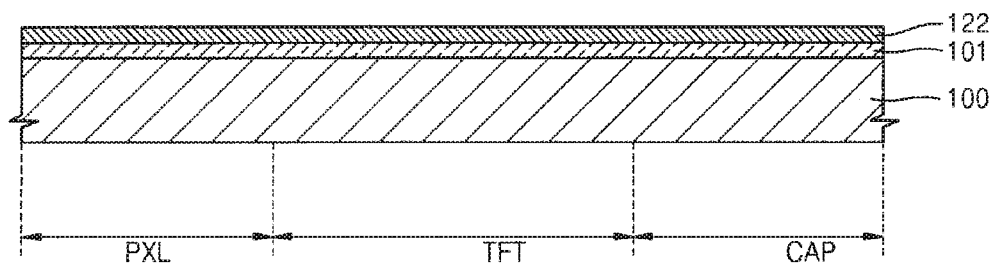

Next, as shown in FIG. 5A, an oxide semiconductor layer 122 is formed on the entire substrate 100.

An oxide semiconductor may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the oxide semiconductor may be formed of Ga, In, and Zn in a 2:2:1 atom % ratio. However, the oxide semiconductor is not limited thereto and may be formed of a four-element metal oxide belonging to an In—Sn—Ga—Zn—O group, a three-element metal oxide belonging to an In—Ga—Zn—O group, an In—Sn—Zn—O group, an In—Al—Zn—O group, a Sn—Ga—Zn—O group, an Al—Ga—Zn—O group, a Sn—Al—Zn—O group, or a Cd—Sn—O group, a two-element metal oxide belonging to an In—Zn—O group, a Sn—Zn—O group, an Al—Zn—O group, a Zn—Mg—O group, a Sn—Mg—O group, or an In—Mg—O group, or a one-element metal oxide belonging to an In—O group, a Sn—O group, a Zn—O group, a Ti—O group, or a Cd—O group, or the like. Herein, an In—Ga—Zn—O-group oxide semiconductor indicates an oxide including at least In, Ga, and Zn, and a composition ratio thereof is not specially limited. In addition, elements in addition to In, Ga, and Zn may be included.

Since a thin-film transistor having an oxide semiconductor layer as an active layer is characterized by higher mobility of charges than a comparable silicon thin-film transistor, separate ion doping for an increase in mobility is not necessary. In addition, since an oxide semiconductor thin-film transistor has a polycrystalline and amorphous structure even at a room temperature, a separate annealing process is not necessary, and thus, the oxide semiconductor thin-film transistor can be manufactured even by a low temperature process. In addition, since an active layer can be formed using a method of forming layers, such as sputtering or the like, the oxide semiconductor thin-film transistor is applicable even to a large-area substrate, and materials used in the formation of the oxide semiconductor thin-film transistor are relatively low in cost.

Figure 5B:
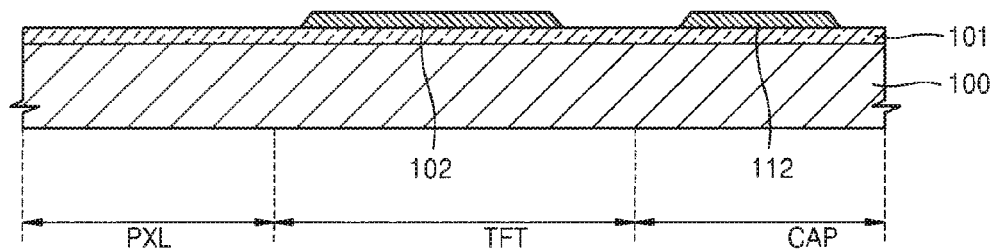

Next, as shown in FIG. 5B, the active layer 102 and the lower electrode 112 are formed by patterning the oxide semiconductor layer 122 with a mask. The active layer 102 is formed in the thin-film transistor region TFT, and the lower electrode 112 is formed in the capacitor region CAP.

Figure 6A:
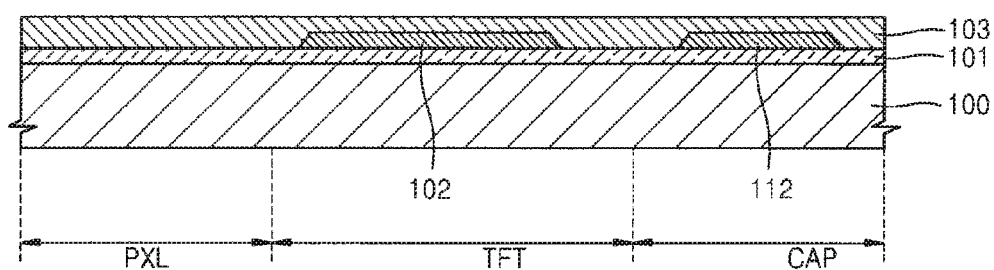

Next, as shown in FIG. 6A, the first insulation film 103 is formed by any one of various suitable deposition methods, such as the PECVD method, the APCVD method, the LPCVD method, or the like, using a silicon nitride ($SiN_x$).

Figure 6B:
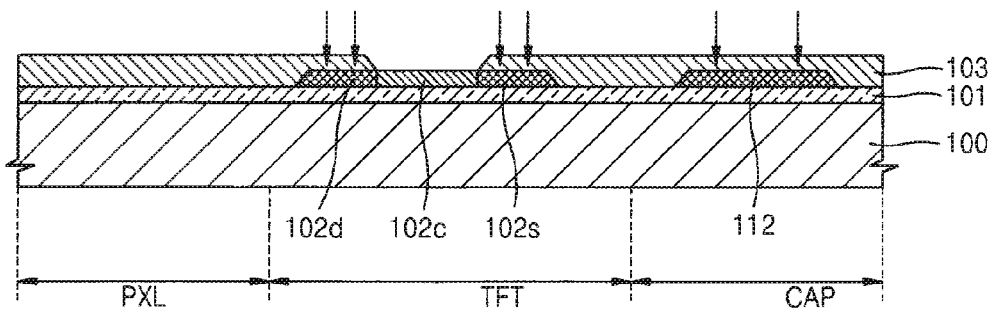

Next, as shown in FIG. 6B, after removing a partial region of the first insulation film 103 in the thin-film transistor region TFT by patterning it with a mask, a partial region of the active layer 102 and the lower electrode 112 are made conductive through an annealing process. As described above, the first insulation film 103 is formed by including $SiN_x$, and the active layer 102 and the lower electrode 112 are oxide semiconductors, and thus, by carrying out the annealing process, hydrogen in $SiN_x$ is diffused to the active layer 102 and the lower electrode 112, thereby making the oxide semiconductors conductive.

At this time, a region of the active layer 102 on which the first insulation film 103 exists becomes the source/drain region 102s/102d, and the region of the active layer 102 on which the first insulation film 103 has been removed becomes the channel region 102c. After the annealing process, since the carrier density of the source/drain region 102s/102d is increased by the hydrogen diffused from the first insulation film 103, the source/drain region 102s/102d may have the property of a conductor, and the channel region 102c maintains the original characteristic of an oxide semiconductor. The source/drain region 102s/102d is located at both ends of the active layer 102, i.e., the remaining region of the active layer 102 except for the channel region 102c, and may include an offset region (refer to 12o of FIG. 2). By making the offset region conductive in an annealing method as described above, a resistance may decrease, thereby improving the characteristic of a thin-film transistor.

In addition, since the first insulation film 103 in the capacitor region CAP is not removed, the carrier density of the lower electrode 112 is increased by the hydrogen diffused from the first insulation film 103 after the annealing process, and thus, the lower electrode 112 has the property of a conductor. Unlike the characteristic of an oxide semiconductor, in the conductive lower electrode 112, a capacity of the capacitor does not vary according to a gate bias.

Figure 7:
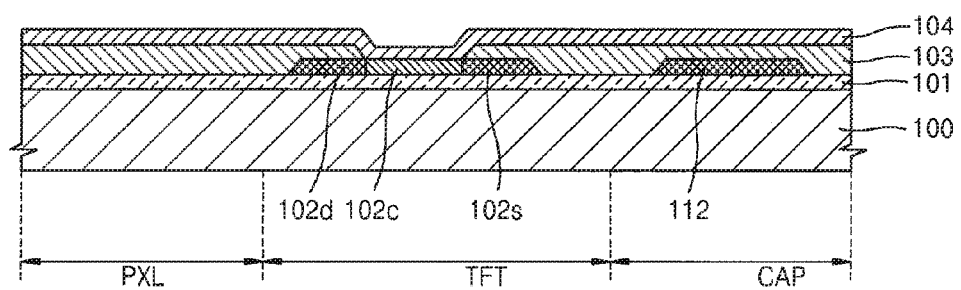

Next, as shown in FIG. 7, a second insulation film 104 is coated on the entire substrate 100.

The second insulation film 104 insulates the active layer 102 from the gate electrode 105 and acts as a dielectric by being disposed between the lower electrode 112 and the intermediate electrode 115 of the capacitor. The second insulation film 104 is formed by any one of various suitable deposition methods, such as the PECVD method, the APCVD method, the LPCVD method, or the like, using an inorganic insulation material selected from among a silicon oxide ($SiO_2$), an aluminum oxide ($AlO_x$), a copper oxide ($CuO_x$), a terbium oxide ($Tb_4O_7$), an yttrium oxide ($Y_2O_3$), a niobium oxide ($Nb_2O_5$), a praseodymium oxide ($Pr_2O_3$), and the like.

In particular, the second insulation film 104 is disposed to contact the channel region 102c in the thin-film transistor region TFT so that a gate insulation film exists even at a place where the first insulation film 103 has been removed through patterning, and the second insulation film 104 is formed as one of dual dielectric materials in the capacitor region CAP.

Although it has been described with reference to FIG. 6B that the carrier density of an oxide semiconductor pattern is increased through the annealing process after patterning the first insulation film 103, according to another embodiment of the present invention, the annealing process may be carried out after forming the second insulation film 104. That is, the annealing process for increasing the carrier density in the source/drain region 102s/102d of the active layer 102 may be variously carried out according to embodiments of the present invention.

Figure 8:
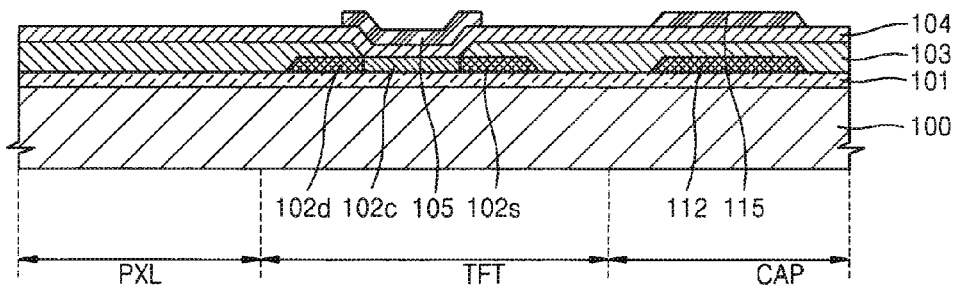

Next, as shown in FIG. 8, the gate electrode 105 and the intermediate electrode 115 are formed.

To form the gate electrode 105 and the intermediate electrode 115, a conductive material may be formed on the entire substrate 100, the gate electrode 105 may be formed in the thin-film transistor region TFT by patterning the conductive material with a mask, and the intermediate electrode 115 may be formed in the capacitor region CAP. The gate electrode 105 is formed to overlap the channel region 102c of the active layer 102 in the thin-film transistor region TFT. The intermediate electrode 115 is formed to overlap the capacitor region CAP.

The gate electrode 105 and the intermediate electrode 115 are each formed by forming a single- or multi-layer conductive film, which includes one or more materials selected from among silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), molybdenum (Mo), titanium (Ti), tungsten (W), and copper (Cu), on the entire second insulation film 104 by a suitable method of forming a conductive film, such as a deposition method, and patterning the single- or multi-layer conductive film with a mask.

Figure 9:
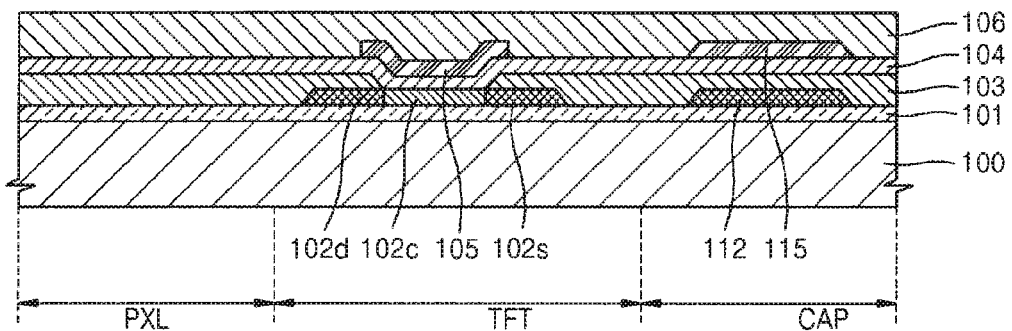

Next, as shown in FIG. 9, after forming an inter-layer insulation film 106 on the entire substrate 100 to cover the gate electrode 105 and the intermediate electrode 115, contact holes are formed in the inter-layer insulation film 106, the first insulation film 103, and the second insulation film 104 to expose the source/drain region 102*s*/102*d* of the active layer 102 in the thin-film transistor region TFT.

The inter-layer insulation film 106 is formed using a suitable method of forming an insulation film, such as spin-coating or the like, using one or more organic insulation materials selected from the group consisting of polyimide, polyamide, an acrylic resin, benzocyclobutene, and a phenol resin. The inter-layer insulation film 106 may be formed of inorganic insulation materials selected from among a silicon oxide ($SiO_2$), an aluminum oxide ($AlO_x$), a copper oxide ($CuO_x$), a terbium oxide ($Tb_4O_7$), an yttrium oxide ($Y_2O_3$), a niobium oxide ($Nb_2O_5$), a praseodymium oxide ($Pr_2O_3$), and the like, instead of the organic insulation materials. In addition, the inter-layer insulation film 106 may be formed in a multi-layer structure in which an organic insulation material and an inorganic insulation material are alternately formed. The inter-layer insulation film 106 may be formed with a sufficient thickness, for example, the inter-layer insulation film 106 may be thicker than the first insulation film 103 described above. The contact holes are formed by patterning with a mask.

Figure 10:
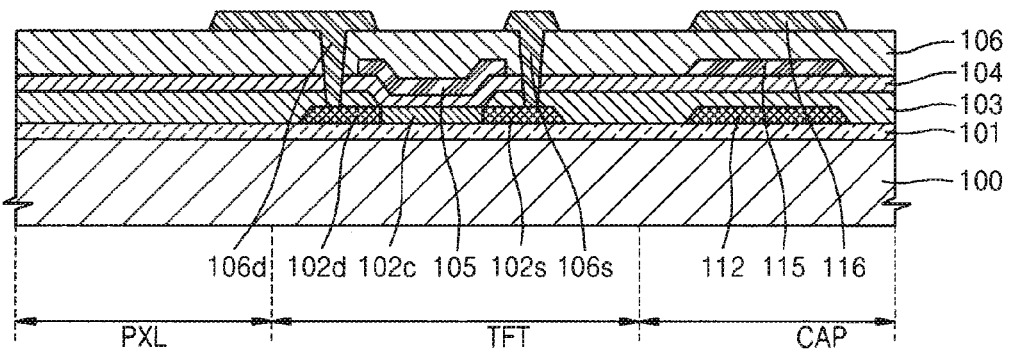

Next, as shown in FIG. 10, the source/drain electrode 106*s*/106*d* is formed to contact the source/drain region 102*s*/102*d* of the active layer 102. In the capacitor region CAP, the upper electrode 116 of the capacitor is formed on the inter-layer insulation film 106.

The source/drain electrode 106*s*/106*d* and the upper electrode 116 are formed by forming a single- or multi-layer conductive film, which includes one or more materials selected from among silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), molybdenum (Mo), titanium (Ti), tungsten (W), and copper (Cu), on the entire inter-layer insulation film 106 using a method of forming a conductive film, such as a deposition method, and patterning the single- or multi-layer conductive film with a mask.

Referring back to FIG. 3, an OLED including a pixel electrode 111, an organic light-emitting layer 113, and an opposed electrode 121 is generated on the source/drain electrode 106*s*/106*d*. The OLED may be formed in the pixel region PXL.

In more detail, a protective layer 107 is formed on the source/drain electrode 106*s*/106*d* and the upper electrode 116, and a via hole for exposing any one of the source/drain electrode 106*s*/106*d* is formed in the protective layer 107. The via hole is formed by patterning with a mask.

The protective layer 107 is formed by a spin-coating method or the like using one or more organic insulation materials selected from the group consisting of polyimide, polyamide, an acrylic resin, benzocyclobutene, and a phenol resin, and an upper surface of the protective layer 107 is formed to be planar to thereby reduce or prevent an abnormality of the OLED.

Next, the OLED is formed on the protective layer 107. The OLED includes both electrodes, which include the pixel electrode 111 and the opposed electrode 121, and the organic light-emitting layer 113 including an organic light-emitting material interposed between both electrodes. Herein, the pixel electrode 111 may be used as an anode, and the opposed electrode 121 may be used as a cathode. It should be apparent that the polarities of the both electrodes may be applied vice versa.

The pixel electrode 111 is formed on the upper surface of the protective layer 107 and is electrically connected to the thin-film transistor through the via hole formed in the protective layer 107. The pixel electrode 111 may be formed of various suitable materials according to a light-emitting type of the organic light-emitting display device 1. For example, for bottom-emission in which an image is displayed in a direction of the substrate 100 or dual-emission in which an image is displayed in both of the direction of the substrate 100 and a reverse direction of the substrate 100, the pixel electrode 111 is formed of a transparent metal oxide. The pixel electrode 111 may include one or more materials selected from among transparent conductive oxides (TCOs), such as an indium tin oxide (ITO), an indium zinc oxide (IZO), a zinc oxide (ZnO), and an indium oxide ($In_2O_3$). For top-emission in which an image is displayed in the reverse direction of the substrate 100, the pixel electrode 111 may further include a reflective electrode formed of a material that reflects light.

Next, a process of forming a pixel definition film 109, the organic light-emitting layer 113, and the opposed electrode 121 on the pixel electrode 111 will be described in more detail with reference to FIG. 3.

The pixel definition film 109 is formed on the entire pixel electrode 111, and an aperture part for exposing the pixel electrode 111 to define a light-emitting part is formed in the pixel definition film 109.

Next, the organic light-emitting layer 113 including a light-emitting layer is formed on the pixel electrode 111 exposed through the aperture part. The organic light-emitting layer 113 may be formed by laminating, in a single or composite structure, an organic emissive layer (EML) and any one or more of function layers, such as, a hole transport layer (HTL), a hole injection layer (HIL), an electron transport layer (ETL), or an electron injection layer (EIL).

The opposed electrode 121 may be formed as a common electrode by being deposited on the entire substrate 100. The opposed electrode 121 may be formed by thinly depositing silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), lithium fluoride (LiF), or a compound thereof. Of course, the opposed electrode 121 may be provided as a reflective electrode or a translucent electrode according to a light-emitting direction.

A capping layer including an inorganic material to protect the opposed electrode 121 may be further formed on the opposed electrode 121.

Although a case where the organic light-emitting layer 113 is formed in the aperture part to form a separate light-emitting material for each pixel has been described as an example in the embodiments described above, the present invention is not limited thereto. The organic light-emitting layer 113 may be commonly formed on the entire protective layer 107 regardless of a position of each pixel. In this case, the organic light-emitting layer 113 may be formed by vertically laminating or mixing layers including light-emitting materials that emit light of, for example, red, green, and blue. Of course, a combination of other colors is possible, but only if white light can be emitted. In addition, a color conversion layer or a color filter for converting the white light to a set or predetermined color may be further included.

To protect the OLED formed on the substrate 100 from the external air, a sealing layer is formed on the entire substrate 100 so as to cover the OLED. The sealing layer may have a structure in which an organic material and an inorganic material are alternately laminated or a structure in which a low melting point inorganic material is formed as a single layer.

Although only one thin-film transistor and one capacitor are shown in the drawings for describing the embodiments of the present invention, this is only for convenience of description, and the present invention is not limited thereto. Of course, a plurality of thin-film transistors and a plurality of capacitors can be included unless a masking process according to the present invention takes a longer time.

According to an embodiment of the present invention, since the OLED is included in the pixel region PXL, the components according to FIG. 3 can be used as an organic light-emitting display device. However, an aspect of the present invention is not limited thereto. For example, if a liquid crystal is included between a pixel electrode and an opposed electrode, FIG. 3 may be used as a liquid crystal display device.

Specific executions described in the present invention are example embodiments and do not limit the scope of the present invention even in any method. For conciseness of the specification, disclosure of conventional electronic configurations, control systems, software, and other functional aspects of the systems may be omitted. In addition, connections or connection members of lines between components shown in the drawings illustrate functional connections and/or physical or circuit connections, and the connections or connection members can be represented by replaceable or additional various functional connections, physical connections, or circuit connections in an actual apparatus. In addition, if there is no concrete use of terms such as "requisite" or "important" to refer to a component, that component may not be necessarily required for application of the present invention.

The use of the term "said" or a similar directional term in the specification (in particular, in claims) of the present invention may correspond to both the singular and the plural. In addition, when a range is disclosed in the present invention, inventions to which individual values belonging to the range are applied are included (if there is no disclosure opposed to this), and this is the same as if each of the individual values forming the range is disclosed in the detailed description of the present invention. Finally, for steps forming the methods according to the present invention, if an order is not clearly disclosed or, if there is no disclosure opposed to the clear order, the steps can be performed in any order deemed proper. The present invention is not necessarily limited to the disclosed order of the steps. The use of all illustrations or illustrative terms (for example, and so forth, etc.) in the present invention is simply to describe the present invention in more detail, and the scope of the present invention is not limited due to the illustrations or illustrative terms unless they are limited by claims. In addition, it will be understood by one of ordinary skill in the art that various modifications, combinations, and changes can be formed according to design conditions and factors within the scope of the attached claims or the equivalents.

According to an embodiment of the present invention, a thin-film transistor having an active layer including an oxide semiconductor can be implemented in a top gate method by making the oxide semiconductor conductive through an annealing process.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing a thin-film transistor, the method comprising:
   forming an oxide semiconductor pattern including a first region and a second region on a substrate;
   forming a first insulation film on the substrate to cover the oxide semiconductor pattern;
   removing the first insulation film on the second region through patterning;
   increasing a carrier density of the first region through an annealing process;
   forming a second insulation film on the oxide semiconductor pattern;
   forming a gate electrode on the second insulation film, insulated from the oxide semiconductor pattern and to overlap the second region; and
   forming a source electrode and a drain electrode insulated from the gate electrode and to contact the first region through openings in the first and second insulation films.

2. The method of claim 1, wherein hydrogen in the first insulation film is diffused to the first region through the annealing process.

3. The method of claim 1, wherein the first insulation film comprises silicon nitride ($SiN_x$).

4. The method of claim 1, wherein the forming of the gate electrode comprises:
   forming the second insulation film on the first insulation film and the second region to insulate the gate electrode from the oxide semiconductor pattern; and
   forming the gate electrode on the second insulation film to overlap the second region.

5. The method of claim 4, wherein the second insulation film comprises a material selected from the group consisting of silicon oxide ($SiO_2$), aluminum oxide ($AlO_x$), copper oxide ($CuO_x$), terbium oxide ($Tb_4O_7$), yttrium oxide ($Y_2O_3$), niobium oxide ($Nb_2O_5$), and praseodymium oxide ($Pr_2O_3$).

6. The method of claim 1, wherein the oxide semiconductor pattern comprises an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn).

7. A method of manufacturing an organic light-emitting display device, the method comprising:
   manufacturing a thin-film transistor on a substrate;
   forming a protective film on the thin-film transistor; and
   forming an organic light-emitting diode (OLED) on the protective film,
   wherein the manufacturing of the thin-film transistor comprises:
   forming an oxide semiconductor pattern comprising an oxide semiconductor and including a first region and a second region on the substrate;
   forming a first insulation film on the substrate to cover the first region except for the second region;
   increasing a carrier density of the first region through an annealing process;
   forming a second insulation film on the oxide semiconductor pattern;

forming a gate electrode on the second insulation film, insulated from the oxide semiconductor pattern and to overlap the second region; and forming a source electrode and a drain electrode insulated from the gate electrode and to contact the first region through openings in the first and second insulation films.

8. The method of claim 7, wherein hydrogen in the first insulation film is diffused to the first region through the annealing process.

9. The method of claim 7, wherein the first insulation film comprises silicon nitride ($SiN_x$).

10. The method of claim 7, wherein the forming of the gate electrode comprises:

forming the second insulation film on the first insulation film and the second region to insulate the gate electrode from the oxide semiconductor pattern; and forming the gate electrode on the second insulation film to overlap the second region.

11. The method of claim 10, wherein the second insulation film comprises a material selected from the group consisting of silicon oxide ($SiO_2$), aluminum oxide ($AlO_x$), copper oxide ($CuO_x$), terbium oxide ($Tb_4O_7$), yttrium oxide ($Y_2O_3$), niobium oxide ($Nb_2O_5$), and praseodymium oxide ($Pr_2O_3$).

12. The method of claim 7, wherein the forming of the oxide semiconductor pattern further comprises forming a lower electrode of a capacitor, wherein the lower electrode comprises the oxide semiconductor.

13. The method of claim 12, wherein a carrier density of the lower electrode of the capacitor increases through the annealing process.

14. The method of claim 12, wherein the forming of the gate electrode further comprises forming an upper electrode of the capacitor.

15. The method of claim 7, wherein the oxide semiconductor pattern comprises an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn).

* * * * *